United States Patent
Tanaka

[19]

[11] Patent Number: 6,091,113
[45] Date of Patent: Jul. 18, 2000

[54] SEMICONDUCTOR DEVICE WITH EVALUATION MISFET

[75] Inventor: Toshiyuki Tanaka, Kawasaki, Japan

[73] Assignee: Fujitsu Limited, Kawasaki, Japan

[21] Appl. No.: 09/268,336

[22] Filed: Mar. 16, 1999

[30] Foreign Application Priority Data

May 20, 1998 [JP] Japan .................................. 10-138638

[51] Int. Cl.⁷ .............................. H01L 29/78; H01L 29/86
[52] U.S. Cl. ............................................. 257/355; 257/348
[58] Field of Search .................................. 257/348, 355, 257/356

[56] References Cited

U.S. PATENT DOCUMENTS 3,999,212  12/1976  Usuda .
4,051,504   9/1977  Hile .
5,550,701   8/1996  Nadd et al. .
5,612,566   3/1997  Williams .

*Primary Examiner*—Stephen D. Meier
*Attorney, Agent, or Firm*—Armstrong, Westerman, Hattori, McLeland & Naughton

[57] ABSTRACT

A depletion type MISFET is formed on a surface of the semiconductor substrate, MISFET including a source region, a drain region, a channel region between the source and drain regions, a gate insulating film on the channel region, and a gate electrode on the gate insulating film. An impurity diffusion region is formed in a surface layer of the semiconductor substrate. An interconnect electrically connects the gate electrode and impurity diffusion region. A p-n junction is reversed biased when a voltage sufficient for cutting off the MISFET is applied to the gate electrode relative to the channel region, an electric path between the impurity diffusion region and the channel region is made non-conductive. Pads are connected to the gate electrode, source region, and drain region.

17 Claims, 6 Drawing Sheets

SEMICONDUCTOR DEVICE WITH EVALUATION MISFET

This application is based on Japanese patent application HEI 10-138638 filed on May 20, 1998, the whole contents of which are incorporated herein by reference.

BACKGROUND OF THE INVENTION a) Field of the Invention

The present invention relates generally to a semiconductor device, and more specifically to a semiconductor device having a MISFET the current-voltage characteristics of which can be evaluated during wafer processes.

b) Description of the Related Art

In order to evaluate the characteristics of a MISFET formed on a semiconductor substrate during manufacture processes of semiconductor devices, a process control monitor (PCM) transistor is formed in addition to desired electronic circuits. Generally, the gate electrode of MISFET in an electronic circuit is connected via an interconnect to an impurity diffusion region in a surface layer of a semiconductor substrate. The gate electrode of a PCM transistor is, however, unnecessary to be connected to the semiconductor substrate. If a plasma process or the like is performed under the condition that the gate electrode is not connected to the semiconductor substrate, electric charges are accumulated in the gate electrode, and the gate insulating film under the gate electrode becomes likely to have a dielectric breakdown. In order to prevent a dielectric breakdown of the gate insulating film, a gate protective element has been used.

FIG. 5 is a cross sectional view of a conventional PCM transistor and a gate protective element. A p-type silicon substrate 100 has a p-type well 101 formed in the surface layer of the substrate. A field oxide film 102 defines an active region in the surface layer of the p-type well 101.

One active region in the p-type well 101 has a MISFET formed therein. MISFET is constituted of a source region 103, a drain region 104, a gate electrode 105, and a gate insulating film 106. Another active region in the surface layer of the p-type well 101 has an n-type impurity diffusion region 107. The gate electrode 105 is connected via an interconnect 115 to the impurity diffusion region 107.

The source region 103, drain region 104, and gate electrode 105 are respectively connected to pads 109, 111, and 110 to which probes are connected. The p-type well 101 is connected to a pad 108. A desired voltage is applied to each pad 108 to 111 to measure the current-voltage characteristics of MISFET.

Electric charges accumulated in the gate electrode 105 during wafer processes flow into the substrate via the interconnect 115 and impurity diffusion region 107. If a breakdown voltage of a p-n junction between the impurity diffusion region 107 and p-type well 101 is set lower than a dielectric breakdown voltage of the gate insulating film 106, it is possible to prevent the dielectric breakdown of the gate insulating film 106.

Consider now that MISFET shown in FIG. 5 is an n-channel depletion type MISFET. Since the threshold voltage of this MISFET is negative, it is necessary to apply a negative voltage to the gate electrode 105 relative to the p-type well 101 in order to measure the threshold voltage. In this case, the p-n junction between the impurity diffusion region 107 and p-type well 101 is forward biased. If a voltage lower than −0.6 V is applied to the gate electrode 105, a forward current flows from the p-type well 101 to the impurity diffusion region 107.

This forward current makes an npn bipolar transistor ON state, the npn transistor having the impurity diffusion region 107, p-type well 101, and drain region 104 as its emitter, base, and collector. Therefore, the drain current of MISFET increases and the intrinsic characteristics of MISFET cannot be measured.

SUMMARY OF THE INVENTION

It is an object of the present invention to provide a semiconductor device capable of measuring the characteristics of MISFET during wafer processes, MISFET having a gate protective element for preventing a dielectric breakdown of the gate insulating film of MISFET.

According to one aspect of the present invention, there is provided a semiconductor device comprising: a semiconductor substrate; a depletion type MISFET formed on a surface of the semiconductor substrate, the MISFET including a source region, a drain region, a channel region between the source and drain regions, a gate insulating film on the channel region, and a gate electrode on the gate insulating film; an impurity diffusion region formed in a surface layer of the semiconductor substrate; an interconnect for electrically connecting the gate electrode and the impurity diffusion region; a p-n junction which is reversed biased when a voltage sufficient for cutting off the MISFET is applied to the gate electrode relative to the channel region, and makes non-conductive an electric path between the impurity diffusion region and the channel region; and pads connected to the gate electrode, the source region, and the drain region, the pads being made in contact with probes.

When a voltage capable of cutting off MISFET is applied, current does not flow between the gate electrode and channel region. The intrinsic threshold voltage of MISFET can therefore be measured.

According to another aspect of the present invention, there is provided a semiconductor device comprising: a semiconductor substrate; a MISFET formed on a surface of the semiconductor substrate, the MISFET including a source region, a drain region, a channel region between the source and drain regions, a gate insulating film on the channel region, and a gate electrode on the gate insulating film; a well of a first conductivity type formed in a surface layer of the semiconductor substrate; an impurity diffusion region formed in the well and having a second conductivity type opposite to the first conductivity type; a surface region of the second conductivity type surrounding the well from a side of the semiconductor substrate; an interconnect for electrically connecting the gate electrode and the impurity diffusion region; and pads connected to the gate electrode, the source region, and the drain region, the pads being made in contact with probes.

When a positive or negative voltage is applied to the gate electrode, either the p-n junction between the well and impurity diffusion region or the p-n junction between the well and surface region is reversed biased. This reversed bias prevents current from flowing between the gate electrode and semiconductor substrate, so that the intrinsic current-voltage characteristics of MISFET can be measured.

As above, electric charges accumulated in the gate electrode of MISFET during wafer processes can be flowed into the substrate via a gate protective element. It is therefore possible to prevent a dielectric breakdown of a gate insulating film. Furthermore, since current does not flow through the gate protective element during measurements of the current-voltage characteristics of MISFET, the intrinsic characteristics of MISFET can be measured.

DETAILED DESCRIPTION OF THE PREFERRED EMBODIMENTS

Figure 1:
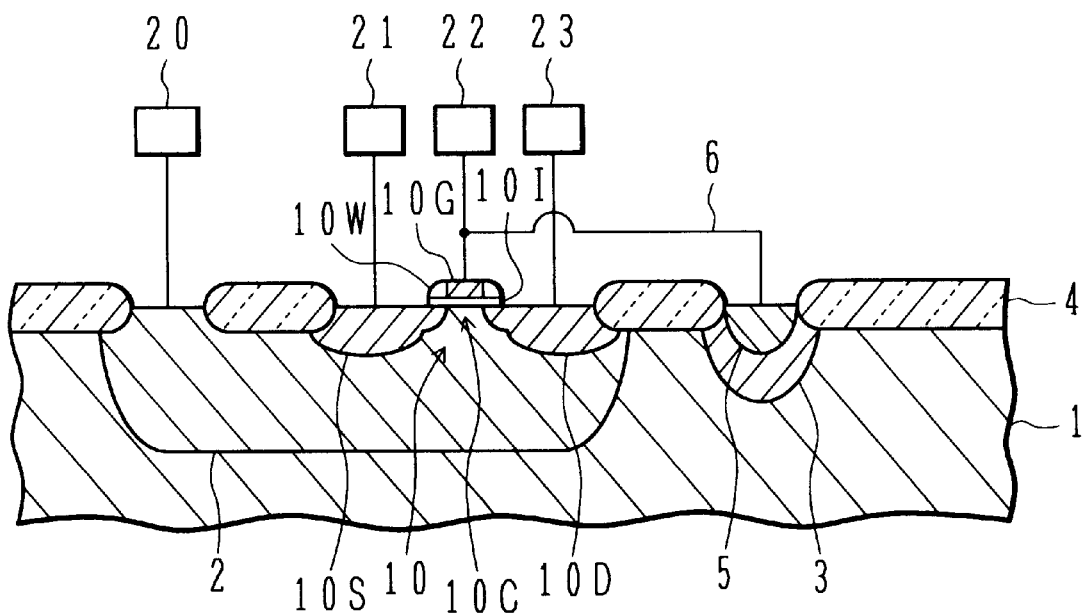
FIG. 1 is a cross sectional view of a semiconductor device according to a first embodiment of the invention.

FIG. 1 is a cross sectional view of a semiconductor device according to the first embodiment of the invention. A p-type silicon substrate 1 has a p-type well 2 and an n-type well 3 formed in the surface layer of the substrate. A field oxide film 4 formed on the surface of the silicon substrate 1 defines an active region in the surface layer of each well.

An n-channel MISFET 10 is formed in the p-type well 2. MISFET 10 is constituted of an n-type source region 10S, an n-type drain region 10D, a channel region 10C formed between the source and drain regions, a gate insulating film 10I formed on the channel region 10C, and a gate electrode 10G formed on the gate insulating film 10I. A p-type impurity diffusion region 5 is formed in the n-type well 3. This impurity diffusion region 5 is connected via an interconnect 6 to the gate electrode 10G. The p-type well 2, source region 10S, gate electrode 10G, and drain region 10D are connected to pads 20, 21, 22, and 23, respectively. Probes are made in contact with these pads to apply a desired voltages to the region connected to these pads.

A method of manufacturing the semiconductor device shown in FIG. 1 will be described. On the surface of a p-type silicon substrate 1, a field oxide film 4 having a thickness of 300 nm is formed through LOCOS. The surfaces of active regions are thermally oxidized to form a through oxide film and thereafter, boron ions are implanted to form a p-type well 2. Boron ion implantation is executed three times. The first implantation conditions are an acceleration energy of 300 keV and a dose of $3.0\times101^{13}$ cm$^{-2}$, the second implantation conditions are an acceleration energy of 80 keV and a dose of $2.0\times10^{12}$ cm$^{-2}$, and the third implantation conditions are an acceleration energy of 30 keV and a dose of $1.0\times10^{13}$ cm$^{-2}$.

Next, phosphorous ions are implanted to form an n-type well 3. Phosphorous ion implantation is executed three times. The first implantation conditions are an acceleration energy of 600 keV and a dose of $3.0\times10^{13}$ cm$^{-2}$, the second implantation conditions are an acceleration energy of 200 keV and a dose of $4.0\times10^{12}$ cm$^{-2}$, and the third implantation conditions are an acceleration energy of 80 keV and a dose of $1.05\times10^{13}$ cm$^{-2}$. At the same time when the n-type well 3 is formed, p-channel MISFET wells are formed in other regions in the surface layer of the silicon substrate 1.

After the ion implantation, the through oxide film is removed. An SiO$_2$ film having a thickness of 5 nm is formed on the surface of the active region by wet oxidization. This SiO$_2$ film is used as a gate insulating film 10I. A polysilicon film having a thickness of 180 nm is grown on the whole surface of the substrate by chemical vapor deposition (CVD). Phosphorous ions are implanted under the conditions of an acceleration energy of 20 keV and a dose of $4.0\times10^{15}$ cm$^{-2}$ to make the deposited polysilicon film have an n-type conductivity. Thereafter, the polysilicon film is patterned to leave a gate electrode 10G.

Low concentration regions of a lightly doped drain (LDD) structure are formed in the region where MISFET 10 is to be formed, by implanting arsenic and phosphorous ions by using the gate electrode 10G as a mask. Arsenic ions are implanted under the conditions of an acceleration energy of 10 keV and a dose of $6.0\times10^{13}$ cm$^{-2}$, and phosphorous ions are implanted under the conditions of an acceleration energy of 10 keV and a dose of $1.5\times10^{13}$ cm$^{-2}$. Thereafter, rapid thermal annealing is performed at 1000° C. to activate implanted impurity ions.

A sidewall insulating film 10W is formed on the sidewall of the gate electrode 10G. The sidewall insulating film 10W is formed by growing an SiO$_2$ film on the whole substrate surface by CVD and thereafter anisotropically etching the SiO$_2$ film through reactive ion etching (RIE).

By using the gate electrode 10G and sidewall insulating film 10W as a mask, arsenic ions are implanted to form a source region 10S and a drain region 10D. This ion implantation is performed under the conditions of an acceleration energy of 40 keV and a dose of $2.0\times10^{15}$ cm$^{-2}$.

Next, a p-type impurity diffusion region 5 is formed in the n-type well 3. The impurity diffusion region 5 is formed by implanting fluorine ions under the conditions of an acceleration energy of 12 keV and a dose of $4.0\times10^{14}$ cm$^{-2}$ and by further implanting boron ions under the conditions of an acceleration energy of 7 keV and a dose of $2.0\times10^{15}$ cm$^{-2}$.

The fluorine ion implantation is expected to improve the bias-temperature (BT) characteristics of the gate insulating film. If the dose of fluorine ions takes an order of $10^{15}$ cm$^{-2}$, some problems occur such as punch-through of boron ions and a thickened gate insulating film. If boron fluoride ions are implanted, the doses of fluorine and boron ions cannot be controlled independently. However, by implanting fluorine ions and boron ions separately as described above, it is possible to independently control the doses of fluorine and boron ions. If there is no problem of the BT characteristics and the like, boron fluoride ions may be implanted.

Rapid thermal annealing (RTA) is performed at a temperature of 1000° C. to activate implanted impurity ions. A silicide film of refractory metal such as Co and Ti may be formed on the source region 10S, drain region 10D, impurity diffusion region 5, and gate electrode 10G, by using known silicidizing techniques.

Thereafter, an interlayer insulating film is formed, contact holes are formed through the insulating film, and an aluminum-wiring pattern is formed. Pads 20 to 23 are formed on the uppermost layer of the wiring layer.

The impurity diffusion region 5, n-type well 3, and silicon substrate 1 constitute a pnp transistor. If a voltage higher than a breakdown voltage between a collector and an emitter with a base being opened (BVCEO) of the pnp transistor is applied between the impurity diffusion region 5 and silicon substrate 1, a conductive path is formed therebetween. The BVCEO is smaller than the dielectric breakdown voltage of the gate insulating film 10I.

After the gate electrode 10G and impurity division region 5 are electrically connected by an interconnect 6 and when a voltage higher than the BVCEO generated by electric charges accumulated in the gate electrode 10G is applied between the gate electrode 10G and channel region 10C, the accumulated electric charges flow into the substrate 1 via the impurity diffusion region 5 and n-type well 3. In this manner, the pnp transistor constituted of the impurity diffusion region 5, n-type well 3, and silicon substrate 1 functions as a gate protective element, so that a dielectric breakdown of the gate insulating film 10I can be prevented.

Figure 2:
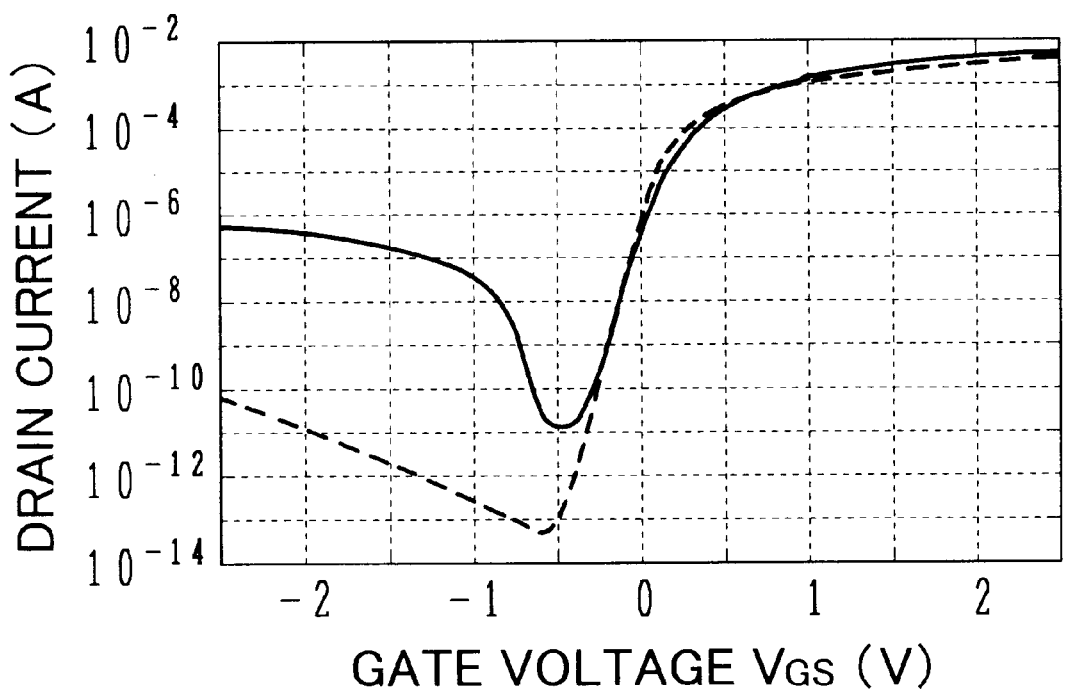
FIG. 2 is a graph showing the measurement results of current-voltage characteristics of MISFET of the semiconductor device of the first embodiment.
Figure 5:
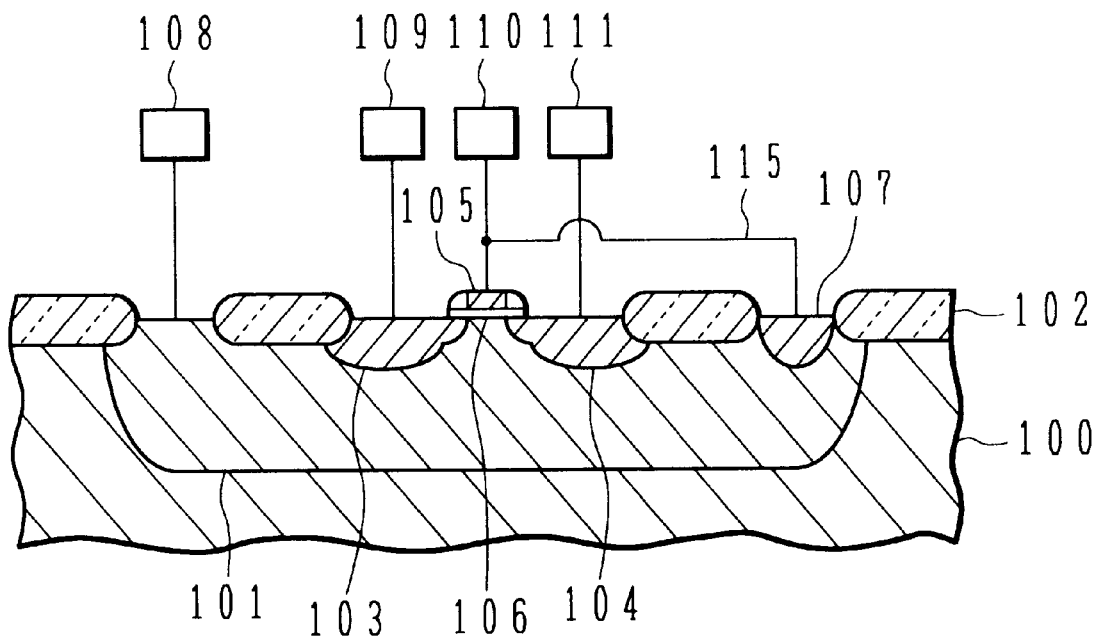
FIG. 5 is a cross sectional view of a conventional semiconductor device.

FIG. 2 is a graph showing the measurement results of the current-voltage characteristics of MISFET 10. The current-voltage characteristics of MISFET 10 can be measured by measuring a drain current by changing a voltage applied to the pad 22, under the conditions that the pads 20 and 21 are grounded and the pad 23 is applied with a voltage of 2.5 V. A broken line in FIG. 2 shows the current-voltage characteristics of MISFET 10. For comparison, the measurement results of the current-voltage characteristics of a conventional MISFET shown in FIG. 5 are indicated by a solid line. The abscissa represents a gate voltage $V_{GS}$ in unit of volt, and the ordinate represents a current in unit of ampere.

As compared to MISFET of the embodiment, the conventional MISFET shown in FIG. 5 has a large drain current in a range of the gate voltage of −0.5 V or lower. This is because the p-n junction between the impurity diffusion region 107 and p-type well 101 shown in FIG. 5 is forward biased to make ON state the npn transistor constituted of the impurity diffusion region 107, p-type well 101, and drain region 104.

In contrast, in this embodiment, if an inversion side voltage, i.e., a positive voltage, is applied to the gate electrode 10G, the p-n junction between the n-type well 3 and silicon substrate 1 is reversed biased so that no current flows between the gate electrode 10G and the substrate 1. If an accumulation side voltage, i.e., a negative voltage, is applied to the gate electrode 10G, the p-n junction between the impurity diffusion region 5 and n-type well 3 is reversed biased so that no current flows between the gate electrode 10G and the substrate 1. Even if a voltage of either a positive polarity or a negative polarity is applied to the gate electrode 10G, current will not flow through the gate protective element, the intrinsic current-voltage characteristics of MISFET 10 can be measured.

As shown by the broken line of FIG. 2, MISFET of this embodiment is cut off at the gate voltage of about −0.5 V. When a voltage sufficient for cutting off MISFET is applied to the gate electrode 10G, the p-n junction between the impurity diffusion region 5 and n-type well 3 is reversed biased. Therefore, the p-n junction between the impurity diffusion region 5 and channel region 10C is made non-conductive and the threshold voltage of MISFET 10 can be measured.

In the embodiment, the n-type region in the n-type well 3 functions as the base of the pnp transistor constituted of the p-type impurity diffusion region 5, n-type well 3, and p-type silicon substrate 1. In order to measure the intrinsic current-voltage characteristics of MISFET 10, it is sufficient for the pnp transistor not to become ON state in the measurement range of the gate voltage. This requirement can be met if the n-type region in the n-type well 3 is not fixed to a certain potential but is made in a floating state. In this embodiment, the n-type region in the n-type well 3 is electrically connected to an electrically conductive region such as a pad only via the p-type impurity diffusion region 5 or p-type region of the silicon substrate 1. Accordingly, the n-type region in the n-type well 3 is made electrically in a floating state.

An n-type MISFET is protected in the embodiment shown in FIG. 1. A p-type MISFET can be protected by connecting the gate electrode of the p-channel MISFET formed in an n-type well to the impurity diffusion region 5.

Next, the second embodiment will be described with reference to FIG. 3. In the first embodiment, a p-type silicon substrate is used and an n-channel MISFET is formed in the p-type well. In the second embodiment, an n-type silicon substrate is used and a p-channel MISFET is formed in the n-type well.

A p-type silicon substrate 31 has an n-type well 33 formed in the surface layer of the substrate. A field oxide film 35 defines a plurality of active regions in the surface layer of the n-type well 33.

A p-channel MISFET 40 is formed in the n-type well 33. MISFET 40 is constituted of a source region 40S, a drain region 40D, a channel region 40C, a gate insulating film 40I, and a gate electrode 40G. The gate electrode 40G has a two-layer structure made of an amorphous silicon film having a thickness of 50 nm and a tungsten silicide film having a thickness of 150 nm.

The n-type well 33 has also a p-type well 34 formed in another region thereof. In the p-type well 34, an n-type impurity diffusion region 36 is formed. The n-type impurity diffusion region 36 is connected via an interconnect 37 to the gate electrode 40G. The n-type well 33, source region 40S, gate electrode 40G, and drain region 40D are connected to pads 50, 51, 52, and 53, respectively.

Figure 3:
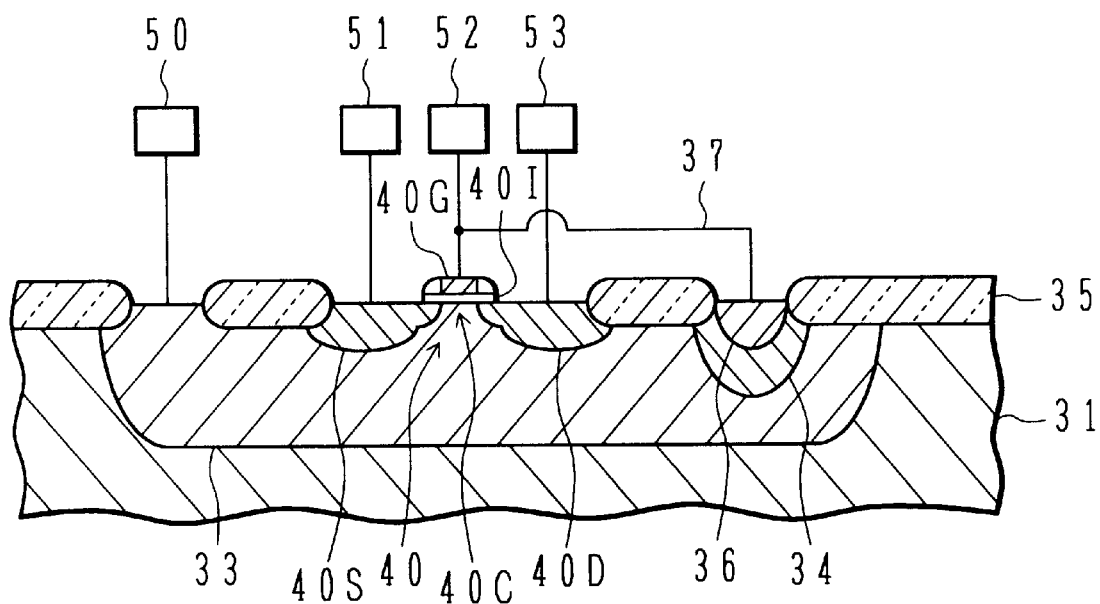
FIG. 3 is a cross sectional view of a semiconductor device according to a second embodiment of the invention.

A method of manufacturing the semiconductor device shown in FIG. 3 is basically the same as the method of manufacturing the semiconductor device shown in FIG. 1. Therefore, only the ion implantation conditions for each well and an impurity diffusion region will be described.

The n-type well 33 is formed by implanting phosphorous ions under the conditions of an acceleration energy of 180 keV and a dose of $1.5 \times 10^{13}$ cm$^{-3}$. The p-type well 34 is formed by implanting boron ions two times. The first implantation conditions are an acceleration energy of 180 keV and a dose of $1.5 \times 10^{13}$ cm$^{-2}$, and the second implantation conditions are an acceleration energy of 115 keV and a dose of $1.0 \times 10^{13}$ cm$^{-2}$. Although not shown, the p-type well of the n-channel MISFET is formed by implanting boron ions two times, first under the conditions of an acceleration energy of 180 keV and a dose of $8.0 \times 10^{12}$ cm$^{-2}$, and then under the conditions of an acceleration energy of 30 keV and a dose of $2.7 \times 10^{12}$ cm$^{-2}$.

The low impurity concentration region of the LDD structure is formed by implanting boron fluoride under the conditions of an acceleration energy of 20 keV and a dose of $1.0 \times 10^{13}$ cm$^{-2}$. The source region 40S and drain region 40D are formed by implanting boron fluoride under the conditions of an acceleration energy of 20 keV and a dose of $3.0 \times 10^{15}$ cm$^{-2}$. The n-type impurity diffusion region 36 is formed by implanting arsenic ions under the conditions of an acceleration energy of 30 keV and a dose of $1.0 \times 10^{5}$ cm$^{-2}$.

In the second embodiment, the gate electrode 40G is connected to the n-type well 33 via the n-type impurity diffusion region 36 and p-type well 34. Therefore, similar to the first embodiment, a dielectric breakdown of the gate insulating film 40I can be prevented and the intrinsic current-voltage characteristics of MISFET 40 can be measured.

A p-type MISFET in the n-type well is protected in the embodiment shown in FIG. 3. An n-type MISFET in the p-type well can be protected by connecting the gate electrode of the p-channel MISFET to the impurity diffusion region 36.

Next, the third embodiment will be described with reference to FIG. 4A. A semiconductor device of the third embodiment has a triple-well structure.

Figure 4A:
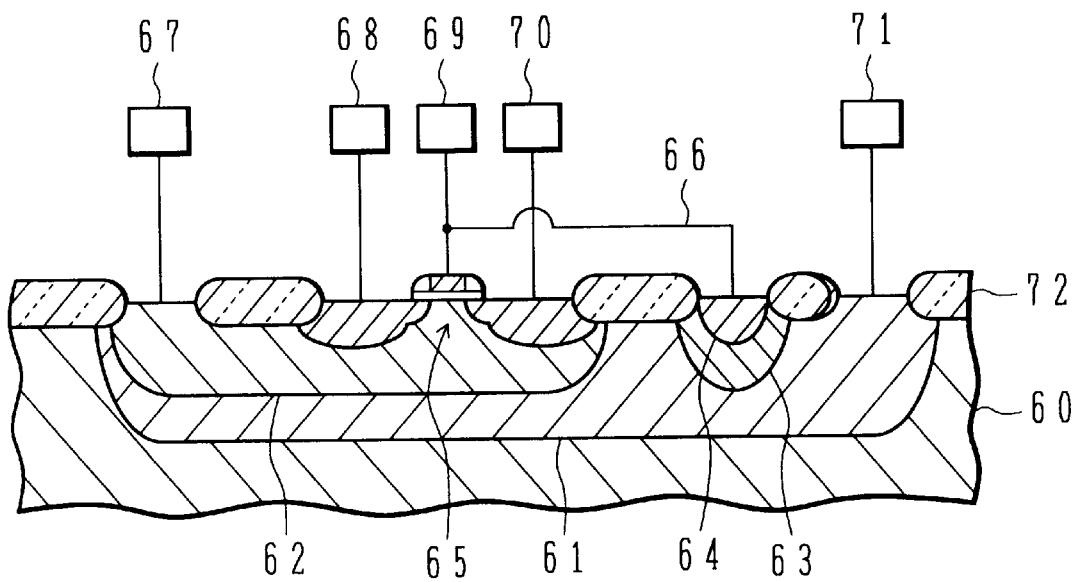
FIGS. 4A and 4B are cross sectional views of semiconductor devices according to a third embodiment of the invention and its modification.

FIG. 4A is a cross sectional view of the semiconductor device of the third embodiment. A p-type silicon substrate 60 has an n-type well 61 formed in the surface layer of the substrate. Two p-type wells 62 and 63 are formed in the n-type well 61. A field oxide film 72 defines active regions on the surface of wells.

The p-type well 62 has an n-channel MISFET 65 formed therein, and the p-type well 63 has an n-type impurity diffusion region 64 formed therein. The gate electrode of MISFET 65 is connected via an interconnect 66 to the n-type impurity diffusion region 64. The p-type well 62, the source region, gate electrode, and drain region of MISFET 65, and the n-type well 61 are connected to pads 67 to 71, respectively.

When a positive or negative voltage is applied to the gate electrode, the p-n junction between the n-type impurity diffusion region 64 and p-type well 63 or the p-n junction between the p-type well 63 and n-type well 61 is reversed biased. The intrinsic characteristics of MISFET 65 can therefore be measured.

In the semiconductor device shown in FIG. 4A, the pad 69 may be directly connected to the p-type well 63 without forming the n-type impurity diffusion region 64. In this case, the p-type well 63, n-type well 61, and p-type well 62 constitute a pnp bipolar transistor which functions as a protective element. If a voltage higher than that applied to the p-type well 63 is applied to the pad 71, i.e., to the base of the bipolar transistor, the p-n junction between the p-type well 63 and n-type well 61 is always reversed biased. The intrinsic current-voltage characteristics of MISFET can therefore be measured.

Application of a high voltage to the pad 71 corresponds to application of a high voltage to the n-type well 3 of the first embodiment shown in FIG. 1. In this case, a pad is provided for the n-type well 3, and the characteristics of MISFET is measured by using five pads. In the first and second embodiments, the base of the bipolar transistor used as the protective element is made in an open state. The characteristics of MISFET can therefore be measured by using four pads. In order to measure the characteristics of MISFET by using a smaller number of pads, it is preferable to make the base of the bipolar transistor in an open state like the first and second embodiments.

Figure 4B:
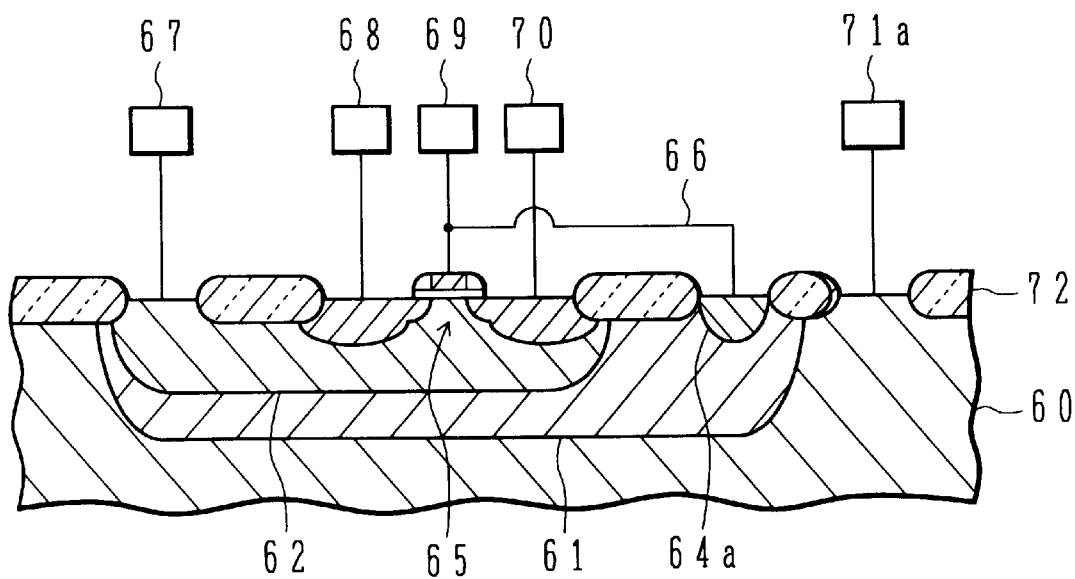

FIG. 4B is a cross sectional view of a semiconductor device according to a modification of the third embodiment. In the third embodiment, the gate electrode of MISFET 65 is connected via the n-type impurity diffusion region 64 and p-type well 63 to the n-type well 61. In the modification of the third embodiment, the gate electrode is connected via the p-type impurity diffusion region 64*a* to the n-type well 61. The n-type well 61 is made in a floating state, and a pad 71*a* in place of the pad 71 of the third embodiment is connected to the p-type silicon substrate 60. The other structures are the same as those of the third embodiment shown in FIG. 4A.

In this modification, during the measurements of the current-voltage characteristics of MISFET 65, a p-n junction between the p-type impurity diffusion region 64*a* and n-type well 61 or a p-n junction between the n-type well 61 and p-type well 62 is reversed biased. The intrinsic current-voltage characteristics of MISFET 65 can therefore be measured.

Figure 6:
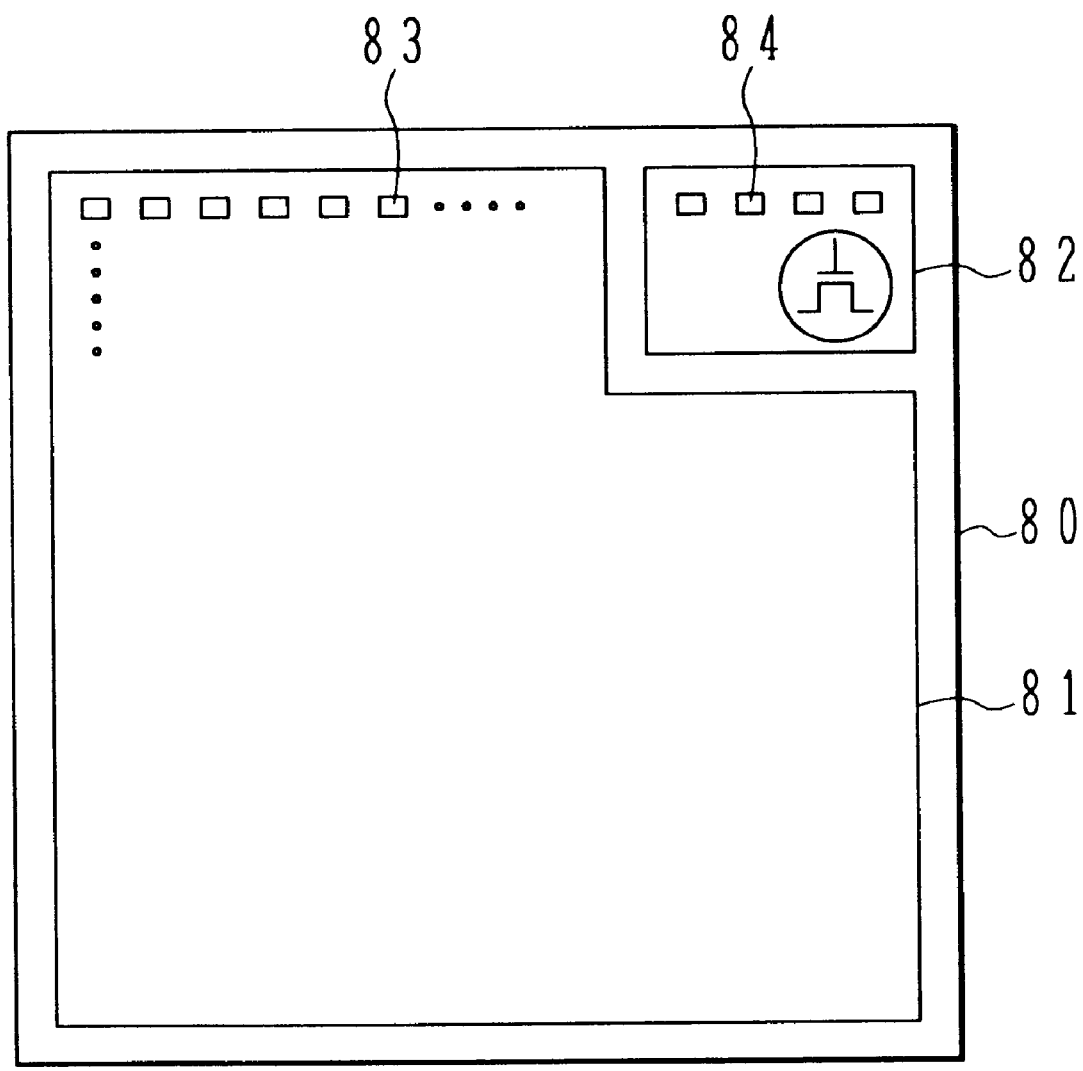
FIG. 6 is a plan view of a chip having a semiconductor device of the embodiment.

FIG. 6 is a plan view showing an example of a semiconductor chip formed with a PCM transistor of any one of the above embodiments. An electronic circuit area 82 and a PCM area 82 are defined on the surface of a semiconductor chip 80. In FIG. 6, the PCM area 82 is shown larger than an actual size. Predetermined electronic circuits are formed in the electronic circuit area 81. A PCM transistor and a protective element of one of the above embodiments are formed in the PCM area 82.

Pads 83 and 84 are disposed in a peripheral area of the semiconductor chip. The pads 84 are used for measuring the threshold voltage of the PCM transistor by contacting probes thereto. The pads 83 are used as signal input/output terminals of the electronic circuits formed in the electronic circuit area 81. The PCM transistor in the PCM area 82 and the electronic circuits in the electronic circuit area 81 are completely separated electrically. By measuring the threshold voltage of the PCM transistor in the PCM area 82, the threshold voltages of MISFET's formed in the electronic circuit area 81 can be evaluated.

In FIG. 6, the PCM area 82 is disposed in the surface of the chip 80 after being scribed. However, it may be disposed in the scribe area of a wafer.

The present invention has been described in connection with the preferred embodiments. The invention is not limited only to the above embodiments. It is apparent that various modifications, improvements, combinations, and the like can be made by those skilled in the art.

What is claimed is:

1. A semiconductor device comprising:
   a semiconductor substrate;
   a depletion type MISFET formed on a surface of said semiconductor substrate, the MISFET including a source region, a drain region, a channel region between the source and drain regions, a gate insulating film on the channel region, and a gate electrode on the gate insulating film;
   an impurity diffusion region formed in a surface layer of said semiconductor substrate;
   an interconnect for electrically connecting the gate electrode and said impurity diffusion region;
   a p-n junction which is reversed biased when a voltage sufficient for cutting off said MISFET is applied to the gate electrode relative to the channel region, and makes non-conductive an electric path between said impurity diffusion region and the channel region; and
   pads connected to the gate electrode, the source region, and the drain region, respectively.

2. A semiconductor device comprising:
   a semiconductor substrate;
   a MISFET formed on a surface of said semiconductor substrate, the MISFET including a source region, a drain region, a channel region between the source and drain regions, a gate insulating film on the channel region, and a gate electrode on the gate insulating film;
   a first well of a first conductivity type formed in a surface layer of said semiconductor substrate;
   an impurity diffusion region formed in said first well and having a second conductivity type opposite to the first conductivity type;
   a surface region of the second conductivity type surrounding said first well from a side of said semiconductor substrate;
   an interconnect for electrically connecting the gate electrode and said impurity diffusion region; and
   pads connected to the gate electrode, the source region, and the drain region, respectively.

3. A semiconductor device according to claim 2, wherein said surface region has a conductivity type same as a conductivity type of said semiconductor substrate.

4. A semiconductor device according to claim 3, further comprising a second well of a conductivity type same as the conductivity type of said semiconductor substrate, said second well being formed in said surface region at a different area from said first well, wherein said MISFET is arranged in said second well.

5. A semiconductor device according to claim 2, wherein said semiconductor substrate has the first conductivity type, and said surface region is made of a second well of the second conductivity type disposed in the surface layer of said semiconductor substrate.

6. A semiconductor device according to claim 5, wherein said MISFET is arranged in s aid second well.

7. A semiconductor device according to claim 5, further comprising a third well of the first conductivity type formed in said second well, wherein said MISFET is arranged in said third well.

8. A semiconductor device according to claim 2, further comprising a second well of the second conductivity type, said second well being formed in said first well at a different area from said impurity diffusion region, wherein said MISFET is arranged in said second well.

9. A semiconductor device according to claim 2, wherein said MISFET is a depletion type.

10. A semiconductor device comprising:
   a semiconductor substrate;
   a MISFET formed on a surface of said semiconductor substrate, the MISFET including a source region, a chain region, a channel region between the source and drain regions, a gate insulating film on the channel region, and a gate electrode on the gate insulating film;
   a well of a first conductivity type formed in a surface layer of said semiconductor substrate;
   an impurity diffusion region formed in said well and having a second conductivity type opposite to the first conductivity type;
   a surface region of the second conductivity type surrounding said well from a side of said semiconductor substrate; and
   an interconnect for electrically connecting the gate electrode and said impurity diffusion region,
   wherein a region of said well of the first conductivity type is electrically connected to a conductive region only via said impurity diffusion region or said surface region.

11. A semiconductor device according to claim 10, wherein said surface region has a conductivity type same as a conductivity type of said semiconductor substrate.

12. A semiconductor device according to claim 10, wherein said semiconductor substrate has the first conductivity type, and said surface region is made of another well of the second conductivity type disposed in the surface layer of said semiconductor substrate.

13. A semiconductor device according to claim 10, wherein said MISFET is a depletion type.

14. A semiconductor device comprising:
   a semiconductor substrate;
   a depletion type MISFET formed on a surface of said semiconductor substrate, MISFET including a source region, a drain region, a channel region between the source and drain regions, a gate insulating film on the channel region, and a gate electrode on the gate insulating film, a threshold value of said MISFET being measurable by contacting particular regions of said semiconductor substrate with probes;
   an impurity diffusion region formed in a surface layer of said semiconductor substrate;
   an interconnect for electrically connecting the gate electrode and said impurity diffusion region; and
   a p-n junction which is reversed biased when a voltage sufficient for cutting off said MISFET is applied to the gate electrode relative to the channel region, and makes non-conductive an electric path between said impurity diffusion region and the channel region.

15. A semiconductor device comprising:
   a semiconductor substrate;
   a MISFET formed on a surface of said semiconductor substrate, MISFET including a source region, a drain region, a channel region between the source and drain regions, a gate insulating film on the channel region, and a gate electrode on the gate insulating film, a threshold value of said MISFET being measurable by contacting particular regions of said semiconductor substrate with probes;
   a well of a first conductivity type formed in a surface layer of said semiconductor substrate;
   an impurity diffusion region formed in said well and having a second conductivity type opposite to the first conductivity type;
   a surface region of the second conductivity type surrounding said well from a side of said semiconductor substrate; and
   an interconnect for electrically connecting the gate electrode and said impurity diffusion region.

16. A semiconductor device according to claim 15, wherein said surface region has a conductivity type same as a conductivity type of said semiconductor substrate.

17. A semiconductor device according to claim 15, wherein said semiconductor substrate has the first conductivity type, and said surface region is made of another well of the second conductivity type disposed in the surface layer of said semiconductor substrate.

* * * * *